US010048489B2

(12) United States Patent
Naono

(10) Patent No.: US 10,048,489 B2
(45) Date of Patent: Aug. 14, 2018

(54) MIRROR DRIVING DEVICE AND DRIVING METHOD FOR SAME

(71) Applicant: FUJIFILM Corporation, Tokyo (JP)

(72) Inventor: Takayuki Naono, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 367 days.

(21) Appl. No.: 14/668,429

(22) Filed: Mar. 25, 2015

(65) Prior Publication Data
US 2015/0198801 A1 Jul. 16, 2015

Related U.S. Application Data

(63) Continuation of application No. PCT/JP2013/074648, filed on Sep. 12, 2013.

(30) Foreign Application Priority Data

Sep. 26, 2012 (JP) .................. 2012-212238

(51) Int. Cl.
G02B 26/10 (2006.01)
G01L 1/16 (2006.01)
(Continued)

(52) U.S. Cl.
CPC ............ *G02B 26/0858* (2013.01); *G01L 1/16* (2013.01); *G01L 1/162* (2013.01); *G01L 1/18* (2013.01);
(Continued)

(58) Field of Classification Search
CPC .... G02B 26/08; G02B 26/10; G02B 26/0858; G02B 26/084; G02B 26/085;
(Continued)

(56) References Cited

U.S. PATENT DOCUMENTS

2010/0245956 A1 9/2010 Terada
2012/0033279 A1 2/2012 Furukawa et al.
2012/0038713 A1 2/2012 Naono

FOREIGN PATENT DOCUMENTS

DE 102007058239 A1 6/2009
JP 2008-40240 A 2/2008
(Continued)

OTHER PUBLICATIONS

English translation of DE 102007058239, machine translated dated Feb. 14, 2017.*

(Continued)

*Primary Examiner* — Jie Lei
(74) *Attorney, Agent, or Firm* — Birch, Stewart, Kolasch & Birch, LLP

(57) ABSTRACT

A mirror driving device is provided. A pair of piezoelectric actuator units are disposed at both sides of a mirror unit so as to sandwich the mirror unit, and each piezoelectric actuator unit is connected with an end portion of the mirror unit through a linking unit. The linking unit has a structure including one or more plate-shaped members whose longitudinal direction is a direction perpendicular to a rotation axis, and functions as a plate-shaped hinge unit in which a plate-shaped member is deformed so as to be deflected in the thickness direction by the drive of the piezoelectric actuator unit. The linking unit is provided with a sensor unit that detects the stress to be generated in the linking unit during the rotational drive of the mirror unit by a resonant vibration.

20 Claims, 9 Drawing Sheets

(51) Int. Cl.
*G01L 1/18* (2006.01)
*H01L 41/187* (2006.01)
*G02B 26/08* (2006.01)
*H01L 41/09* (2006.01)

(52) U.S. Cl.
CPC ........ *G02B 26/105* (2013.01); *H01L 41/0953* (2013.01); *H01L 41/1875* (2013.01); *H01L 41/1876* (2013.01)

(58) Field of Classification Search
CPC .............. G02B 26/0833; G02B 26/101; G02B 26/106; G02B 26/105; G02B 7/18; H01L 41/1875; H01L 41/1876; H01L 41/0953; H01L 41/187; G01L 1/162; G01L 1/16; G01L 1/18; B60R 1/06; B60R 1/072; H04N 9/3129
USPC ......... 359/221.2, 201.2, 211.5, 212.1, 200.6, 359/223.1, 224.1, 214.1, 198.1, 199.2, 359/199.4, 298, 872, 873, 874
See application file for complete search history.

(56) References Cited

FOREIGN PATENT DOCUMENTS

| JP | 2009-258210 A | 11/2009 | | |
|----|---------------|---------|---|---|
| JP | WO 2010003135 | * 11/2010 | ............ | G02B 26/10 |
| JP | 2011-95523 A | 5/2011 | | |
| JP | 2011-150055 A | 8/2011 | | |

OTHER PUBLICATIONS

Extended European Search Report for European Application No. 13841383.6, dated Apr. 6, 2016.

International Search Report, dated Nov. 5, 2013, issued in PCT/JP2013/074648.

Iseki et al., "High-Speed and Wide-Angle Deflection Optical MEMS Scanner Using Piezoelectric Actuation", IEEJ Transactions on Electrical and Electronic Engineering, 2010, vol. 5, pp. 361-368.

Koh et al., "A 2-D MEMS scanning mirror based on dynamic mixed mode excitation of a piezoelectric PZT thin film S-shaped actuator", Optics Express, 2011, vol. 19, No. 15, pp. 13812-13824.

Written Opinion of the International Searching Authority, dated Nov. 5, 2013, issued in PCT/JP2013/074648.

Yalcinkaya et al., "Two-Axis Electromagnetic Microscanner for High Resolution Displays", Journal of Microelectromechanical Systems, 2006, vol. 15, No. 4, pp. 786-794.

* cited by examiner

| Nb DOPING AMOUNT (%) | 0 | 3 | 6 | 10 | 12 |
|---|---|---|---|---|---|
| SCAN ANGLE @0.5 Vpp DRIVE (°) | 4.2 | 10.7 | 28.1 | 40.3 | 43.7 |
| ANGLE DETECTABILITY (mV/deg) | 1.2 | 2.2 | 7 | 10.1 | 11 |
| POLARIZATION NECESSITY | C | C | A | AA | AA |

MIRROR DRIVING DEVICE AND DRIVING METHOD FOR SAME

CROSS-REFERENCE TO RELATED APPLICATIONS

This application is a Continuation of PCT International Application No. PCT/JP2013/074648 filed on Sep. 12, 2013, which claims priority under 35 U.S.C § 119(a) to Japanese Patent Application No. 2012-212238 filed on Sep. 26, 2012. Each of the above applications is hereby expressly incorporated by reference, in their entirety, into the present application.

BACKGROUND OF THE INVENTION

Field of the Invention

The present invention relates to a mirror driving device, and particularly, a structure of a micro-mirror device suitable for an optical deflector to be used for optical scanning, and relates to a driving method therefor.

Description of the Related Art

A micro-scanner (hereinafter, referred to as a "MEMS (Micro Electro Mechanical System) scanner") made using a fine processing technology for silicon (Si) is characterized in that it has a small size and a low power consumption compared to a polygon mirror, which is a conventional optical scan module, and the like. Therefore, the MEMS scanner is expected to be widely applied, for example, to a laser projector, and a scanner for optical diagnostics such as optical coherence tomography (OCT).

As the structure of the MEMS scanner, a torsion bar system shown in Japanese Patent Application Laid-Open No. 2011-150055 (PTL 1), Japanese Patent Application Laid-Open No. 2008-40240 (PTL 2) and the like is typical. In this system, two, or three or more torsion bars supporting a mirror are twisted. Thereby, the mirror is inclined, and the optical scan is performed. For actualizing a specially large scan angle, a resonant drive is performed. In this case, the structure design is performed such that the resonant frequency of the inclining motion of the mirror coincides with the frequency of the drive.

Further, for the drive of the MEMS scanner, there is known a configuration in which an angle sensor capable of sensing the angle of the mirror is provided for the purpose of monitoring the angle of the mirror and maintaining a resonance state. As for conventional MEMS scanners with the torsion bar system, there are proposed a configuration in which an angle sensor utilizing the piezo-resistance effect is provided at a base portion of the torsion bar ("JOURNAL OF MICROELECTROMECHANICAL SYSTEMS", Vol. 15, No. 4, August 2006, (NPL 1)), and a configuration in which an angle sensor utilizing the piezoelectric effect of the a piezoelectric thin film is used (T. Iseki et. al., IEEJ Trans. Elec. Electron. Eng. 2010, 5, pp. 361-368, (NPL 2)), and some has been put to practical use.

SUMMARY OF THE INVENTION

As described above, for putting a MEMS scanner having a large scan angle to practical use, it is demanded to satisfy the following two points in design.

(1) The resonant frequency of the structure coincides with the drive frequency.

(2) An angle sensor is implemented.

However, in the case of the use for drive at a relatively low frequency, it is necessary to reduce the resonant frequency of the structure. When the design for this is tried with the torsion bar system, there is a problem in that the torsion bar, which plays the role of a spring, must be extremely weakened. As an example, in the case of the use for performing the scan while performing the measurement with light, such as an OCT, the drive at a low frequency of 400 Hz (hertz) or less is performed. When such actualization is tried with the torsion bar system, it is necessary to form the torsion bar by processing Si, for example, at dimensions of: a thickness of 5 μm (micrometers), a width of 10 and a length of 600 μm. There is a problem in that this is a very weak structure, and therefore is easily broken when an impact is given, for example, during the production process or during the device drive. Further, the length dimension of the torsion bar is increased, leading to an increase in the size of the element.

Meanwhile, as a design appropriate for the drive at a low frequency, there is also proposed an example in which a flat spring structure (plated-shaped hinge) folded back in a meandering (meander) form is used (Koh et. al., OPTICS EXPRESS Vol. 19 No. 15 (2011) 13812, (NPL 3)). In the structure shown in NPL 3, multiple flat springs are joined so as to be folded back at multiple positions in a meandering form, and thereby, the resonant frequency can be kept low. Further, compared to the case of the torsion bar, each one of the flat springs has a structure with a higher rigidity, and therefore, is hard to break by an external vibration.

However, in the structure shown in NPL 3, the conventional angle sensor shown in NPLs 1, 2 cannot be applied, and it is difficult to sense the angle. Therefore, it is impossible to embed a circuit for tracking the resonance, and the like, and it is difficult to put it to practical use.

The present invention, which has been made in view of such circumstances, has an object to provide a mirror driving device that has a small size, that can actualize a large mirror inclination angle (rotation angle) at a low drive frequency, and that is equipped with an angle sensing function, and to provide a driving method therefor.

For achieving the above object, the following invention is provided.

(First Aspect): A mirror driving device according to a first aspect includes: a mirror unit configured to have a reflection surface to reflect light; a pair of piezoelectric actuator units configured to be disposed at both sides of the mirror unit so as to sandwich the mirror unit; linking units each of which is configured to connect one end of the piezoelectric actuator unit with an end portion of the mirror unit, the end portion of the mirror unit being away from a rotation axis of the mirror unit in a direction which is along the reflection surface and is perpendicular to the rotation axis; and a fixing unit configured to support the other end of the piezoelectric actuator unit, in which the linking unit is a plate-shaped hinge unit that has a structure including one or more plate-shaped members whose longitudinal direction is a direction that is along the reflection surface and that is perpendicular to the rotation axis, and in the linking unit, the plate-shaped members are deformed so as to be deflected in a thickness direction by a drive of the piezoelectric actuator unit, and the linking unit is provided with a stress detecting unit that detects a stress to be generated in the linking unit during a rotational drive of the mirror unit by a resonant vibration, the resonant vibration being induced by the drive of the piezoelectric actuator units and involving a rotational motion of the mirror unit.

According to this aspect, the pair of piezoelectric actuator units are disposed so as to sandwich the mirror unit from both sides. The one end of the piezoelectric actuator unit is connected with the end portion of the mirror unit through the linking unit, and the other end is supported by the fixing unit. When the piezoelectric actuator unit is driven, the end portion of the mirror unit is displaced, and the inertia torque induces the resonance of the rotational motion, so that a large rotation angle (the inclination angle of the mirror) can be obtained. During the rotational drive of the mirror unit by the resonance, the plate-shaped member of the linking unit, which functions as a plate-shaped hinge unit, is deformed so as to be deflected (bent) in the thickness direction, and a stress corresponding to the deformation is detected by the stress detecting unit. The deformation amount of the linking unit and the angle of the mirror unit have a certain correspondence relation, and also, the deformation amount of the linking unit and the stress to be applied to the linking unit have a correspondence relation. Therefore, the stress detecting unit can function as an angle sensor. Here, in the case of a configuration in which multiple plate-shaped members are included, the stress detecting unit only needs to be included in at least one plate-shaped member.

(Second Aspect): The mirror driving device according to the first aspect can adopt a configuration in which the linking unit has a structure in which two or more of the plate-shaped members are arrayed so as to be folded back in a meandering form, and at the time of the resonant vibration, adjacently arrayed plate-shaped members are deformed so as to be deflected in opposite directions to each other.

The plate-shaped hinge unit having the structure in which the multiple plate-shaped members are joined in a meandering form is employed, and thereby, the design for keeping the resonant frequency low is easy. Further, each one of the plate-shaped members can have a structure with a relatively high rigidity, resulting in a structure that is hard to break by an external vibration.

(Third Aspect): Preferably, the mirror driving device according to the second aspect should adopt a configuration in which, when consecutive numbers indicating an array order are given to the two or more of the plate-shaped members arrayed so as to be folded back in the meandering form, from a side close to the mirror unit toward a direction of the piezoelectric actuator unit, and thereby, each of the plate-shaped members is identified, the mirror driving device includes, as the stress detecting unit, a first stress detecting unit configured to detect a stress to be generated in an odd-numbered plate-shaped member, and a second stress detecting unit configured to detect a stress to be generated in an even-numbered plate-shaped member.

To the odd-numbered plate-shaped member and the even-numbered plate-shaped member, stresses in the opposite directions to each other are applied during the resonant drive. Therefore, the detection in combination of them allows for the improvement of the detection sensitivity and the improvement of the detection accuracy.

(Fourth Aspect): In the mirror driving device according to any one of the first aspect to the third aspect, the stress detecting unit can have a laminate structure in which a lower electrode, a piezoelectric substance and an upper electrode are laminated on the plate-shaped member in order, and can have a structure in which the stress is converted into an electric signal by a piezoelectric effect of the piezoelectric substance.

According to this aspect, the stress to be applied to the plate-shaped member is detected as the voltage between the upper electrode and the lower electrode, allowing for the function as an angle sensor.

(Fifth Aspect): Preferably, the mirror driving device according to the fourth aspect in the case of employing the third aspect should adopt a configuration in which voltage signals are acquired from both of the first stress detecting unit and the second stress detecting unit, respectively, and the mirror driving device comprises a detecting circuit configured to detect differential between a first detection signal acquired from the first stress detecting unit and a second detection signal acquired from the second stress detecting unit.

Particularly, by acquiring the first detection signal and second detection signal that have opposite phases to each other (the phase difference is 180°) and obtaining the differential between both, it is possible to achieve the improvement of the detection sensitivity and to achieve the improvement of the signal/noise ratio (S/N ratio).

(Sixth Aspect): The mirror driving device according to any one of the first aspect to the third aspect can adopt a configuration in which a surface portion of the plate-shaped member is composed of a material exhibiting a piezo-resistance effect, and the stress detecting unit converts the stress into a change in resistance value, by the piezo-resistance effect of the material exhibiting the piezo-resistance effect.

As means for detecting the stress to be applied to the linking unit, the configuration utilizing the piezo-resistance effect can be employed, without being limited to the configuration utilizing the piezoelectric effect.

(Seventh Aspect): The mirror driving device according to the sixth aspect can be configured to include a detecting circuit configured to convert the change in resistance value into a voltage signal.

By applying an electric current to the material exhibiting the piezo-resistance effect, it is possible to acquire the information about the voltage corresponding to the resistance value.

(Eighth Aspect): The mirror driving device according to the seventh aspect in the case of employing the third aspect can adopt a configuration in which the detecting circuit acquires the voltage signal with a voltage dividing circuit configured to connect a first resistance configured by the first stress detecting unit and a second resistance configured by the second stress detecting unit.

This aspect allows a detection in which the influence of the temperature dependence of the piezo-resistance effect is removed.

(Ninth Aspect): In the mirror driving device according to any one of the first aspect to the eighth aspect, the piezoelectric actuator unit can be configured by a piezoelectric unimorph cantilever in which a vibration plate, a lower electrode, a piezoelectric substance and an upper electrode are laminated in order.

A piezoelectric cantilever is not limited to a unimorph structure, and a bimorph structure is also possible. However, the unimorph structure is the simplest configuration. The piezoelectric drive system makes it possible to perform the drive simply by applying a voltage between the electrodes, resulting in a simple configuration and an advantage in downsizing.

(Tenth Aspect): In the mirror driving device according to the ninth aspect in the case of employing the fourth aspect, the piezoelectric substance to be used in the piezoelectric actuator unit and the stress detecting unit can be a thin film that has a thickness of 1 to 10 µm and that is directly formed on a substrate, the substrate being the vibration plate.

According to this aspect, it is possible to make the piezoelectric actuator unit and the stress detecting unit by an identical process. Further, by using a direct film formation method such as a vapor growth method, which is typified by a sputtering method, and a sol-gel method, it is possible to obtain a piezoelectric substance thin film having a necessary piezoelectric performance. A thin film of the piezoelectric substance is directly formed on the substrate, and is processed by a semiconductor process such as a dry etching and a wet etching. Thereby, it is possible to simplify the making process of the device.

(Eleventh Aspect): In the mirror driving device according to any one of the first aspect to the tenth aspect, the piezoelectric substance to be used in the piezoelectric actuator unit can be one kind of, or two or more kinds of perovskite-type oxides that are represented by the following Formula (P).

$$General\ Formula\ ABO_3 \tag{P}$$

(In the formula, A: a chemical element at A-sites, and at least one kind of chemical element including Pb
B: a chemical element at B-sites, and at least one kind of chemical element selected from the group consisting of Ti, Zr, V, Nb, Ta, Sb, Cr, Mo, W, Mn, Sc, Co, Cu, In, Sn, Ga, Zn, Cd, Fe and Ni
O: an oxygen element
A molar ratio of the A-site chemical element, the B-site chemical element and the oxygen element is 1:1:3 as a standard, but the molar ratio thereof may be deviated from the standard molar ratio within a range allowing for a perovskite structure.)

Here, the same piezoelectric material as the piezoelectric actuator unit can be used also for the piezoelectric substance to be used in the stress detecting unit.

(Twelfth Aspect): In the mirror driving device according to any one of the first aspect to the tenth aspect, the piezoelectric substance to be used in the piezoelectric actuator unit can be one kind of, or two or more kinds of perovskite-type oxides that are represented by the following Formula (PX).

$$A_a(Zr_x,Ti_y,M_{b-x-y})_bO_c \tag{PX}$$

(In the formula, A: a chemical element at A-sites, and at least one kind of chemical element including Pb
M: at least one kind of chemical element selected from the group consisting of V, Nb, Ta and Sb
$0<x<b$, $0<y<b$, and $0 \leq b-x-y$
a:b:c=1:1:3 is standard, but the molar ratio thereof may be deviated from the standard molar ratio within a range allowing for a perovskite structure.)

The PZT in which a chemical element such as Nb has been doped has a high piezoelectric constant, and therefore, is suitable for the making of a device that has a small size and gives a large displacement. Here, the same piezoelectric material as the piezoelectric actuator unit can be used also for the piezoelectric substance to be used in the stress detecting unit.

(Thirteenth Aspect): In the mirror driving device according to the twelfth aspect, it is preferable that the perovskite-type oxide (PX) includes Nb, and a molar ratio of Nb/(Zr+Ti+Nb) is 0.06 or more and 0.20 or less.

Such a material exhibits a good piezoelectric property with no polarization process. Therefore, the polarization process is unnecessary, allowing for the actualization of the simplification and cost reduction in the production process.

(Fourteenth Aspect): In the mirror driving device according to the first aspect to the thirteenth aspect, the piezoelectric substance to be used in the piezoelectric actuator unit can be a thin film that is formed by a sputtering method.

(Fifteenth Aspect): The mirror driving device according to any one of the first aspect to the fourteenth aspect can be configured to include a driving circuit configured to supply a drive voltage to the pair of the piezoelectric actuator units, the driving circuit supplying the drive voltage that resonantly drives the mirror unit around a resonant frequency fx in a resonance mode in which the mirror unit performs a rotational motion about the rotation axis.

According to this aspect, it is possible to vibrate the mirror unit at a large rotation angle, utilizing the rotation resonance.

(Sixteenth Aspect): A mirror driving method for the mirror driving device according to any one of the first aspect to the fifteenth aspect includes: applying a drive voltage to the pair of the piezoelectric actuator units to vibrate the piezoelectric actuator units; and vibrating a connecting part between the mirror unit and the linking unit to give, by the vibration, a rotational torque around the rotation axis to the mirror unit and to resonantly drive the mirror unit.

(Seventeenth Aspect): The mirror driving method according to the sixteenth aspect can further include controlling the drive voltage or a drive frequency to be applied to the piezoelectric actuator units, using a detection signal acquired from the stress detecting unit while the mirror unit is resonantly driven.

For example, a configuration in which at least one of the frequency (drive frequency) and amplitude of the drive voltage to be supplied to the piezoelectric actuator unit is controlled based on the detection signal acquired from the stress detecting unit can be adopted. By feeding back, to the drive of the piezoelectric actuator unit, the detection signal acquired from the stress detecting unit, it is possible to actualize a stable resonant drive.

According to the present invention, it is possible to provide a mirror driving device that is smaller in size and can implement a large mirror inclination angle (rotation angle) at a low drive frequency compared to the conventional torsion bar system, and that is equipped with an angle sensing function.

DETAILED DESCRIPTION OF EXEMPLARY EMBODIMENTS

Hereinafter, embodiments of the present invention are described in detail with reference to the accompanying drawings.

First Embodiment

Figure 1:
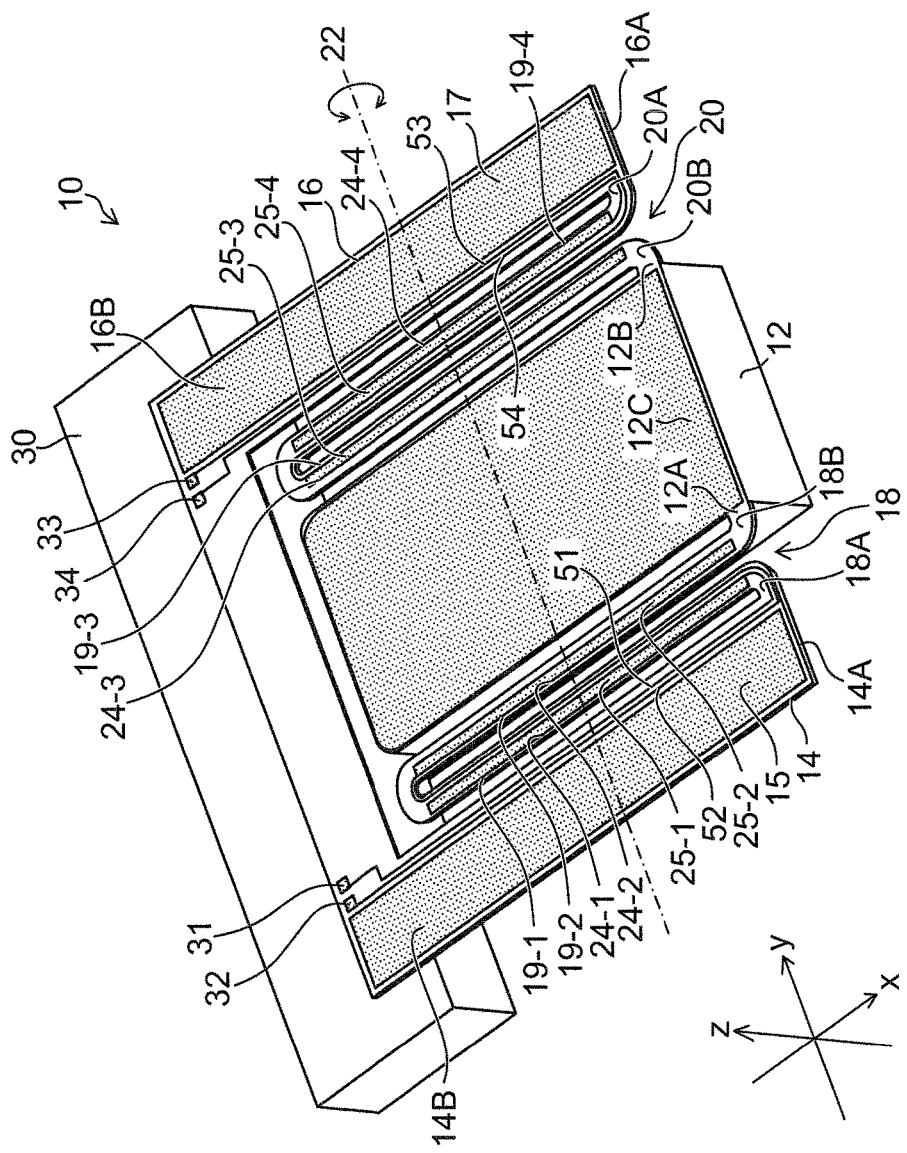
FIG. 1 is a perspective view of a MEMS scanner device according to a first embodiment.
Figure 2:
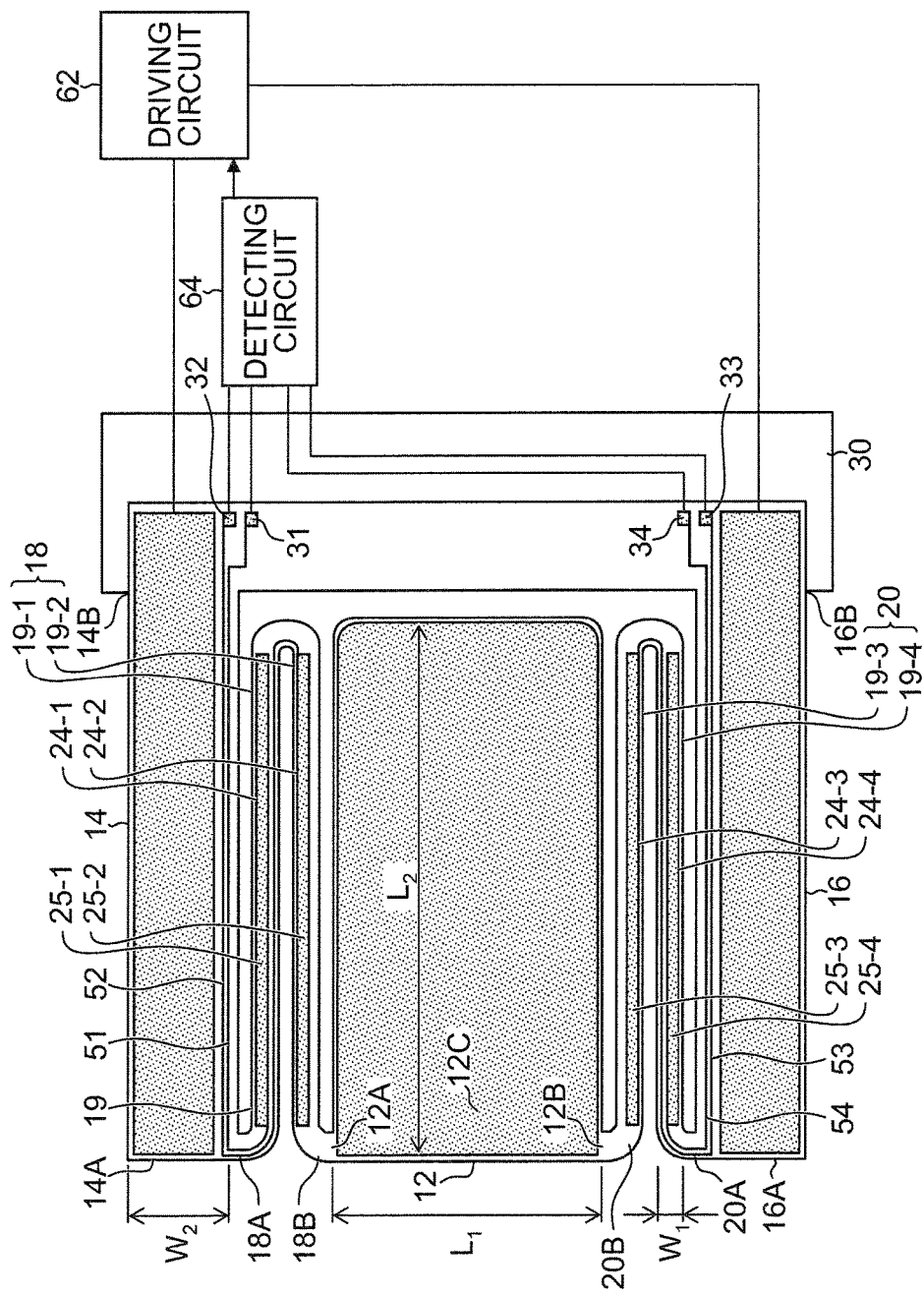
FIG. 2 is an explanatory diagram that is a combination of a plan view of the MEMS scanner device in FIG. 1 as viewed from a reflection surface side of a mirror unit and a block configuration diagram showing circuit elements.

FIG. 1 is a perspective view of a MEMS scanner device according to a first embodiment. FIG. 2 is an explanatory diagram that is a combination of a plan view (top view) of the MEMS scanner device according to the first embodiment as viewed from a reflection surface side of a mirror unit and a block configuration diagram showing circuit elements for device drive and angle detection.

As shown in these figures, a MEMS scanner device 10 (corresponding to a "mirror driving device") according to the embodiment includes a mirror unit 12, a pair of piezoelectric actuator units 14, 16 that are disposed at both sides of the mirror unit 12 so as to sandwich it, linking units 18, 20 that join one end portions 14A, 16A of the respective piezoelectric actuator units 14, 16 and end portions 12A, 12B of the mirror unit 12, and a fixing frame 30 (corresponding to a "fixing unit") that fixedly supports the other end portions (hereinafter, referred to as base end portions) 14B, 16B of the piezoelectric actuator units 14, 16.

For convenience of explanation, in some cases, the piezoelectric actuator unit of reference numeral 14 is referred to as the "first piezoelectric actuator unit", and the piezoelectric actuator unit of reference numeral 16 is referred to as the "second piezoelectric actuator unit". Further, in some cases, the linking unit of reference numeral 18 is referred to as the "first linking unit", and the linking unit of reference numeral 20 is referred to as the "second linking unit". Further, in some cases, the end portion of reference character 12A is referred to as the "first end portion", and the end portion of reference character 12B is referred to as the "second end portion".

As shown in the figure, the mirror unit 12 according to the embodiment has a roughly rectangular shape in planar view, and for increasing the reflectance of incident light, a metallic thin film of Au (gold), Al (aluminum) or the like is formed on a mirror surface (a top surface of the mirror unit 12), which is a reflection surface 12C to reflect light. The material to be used for the mirror coating and the film thickness are not particularly limited, and various designs are possible using a known mirror material (a high-reflectance material).

As for the shape of the mirror unit 12, the "rectangular shape", without being limited to a strict rectangular shape (tetragon), means a shape in which the whole of the basic shape can be roughly grasped as a rectangular shape. Examples thereof include a shape in which the corner portions of a rectangular shape are chamfered, a shape in which the corner portions are rounded off, a shape in which a part or whole of a side is configured by a curved line or a polygonal line, a shape in which an additional shape necessary for linking is added to the connecting parts between the mirror unit 12 and the respective linking units 18, 20, and the like.

In the practice of the present invention, the shape of the mirror unit 12 is not particularly limited. Without being limited to an oblong shape exemplified in FIG. 1 and FIG. 2, various shapes such as a square shape, a polygonal shape, a circular shape and an elliptical shape are possible. Further, the planar view shape of the mirror unit 12 and the shape of the reflection surface 12C may be coincide, or may be different. The reflection surface 12C can be formed within the area range of the top surface of the mirror unit 12.

The embodiment exemplifies the mirror unit 12 having the reflection surface 12C with a roughly oblong shape in planar view, and, for explanation, applies orthogonal x, y and z axes in which the x-direction is defined as the long-side direction of the mirror unit 12 at the time of non-driving, the y-direction is defined as the short-side direction orthogonal to the y-direction, and the z-direction is defined as the direction perpendicular to the xy plane.

In the MEMS scanner device 10, the pair of piezoelectric actuator units 14, 16 are disposed so as to sandwich both sides in the y-axis direction of the mirror unit 12 in which the reflection surface 12C is oriented in the z-axis direction at the time of non-driving. The respective piezoelectric actuator units 14, 16 are actuators having a piezoelectric unimorph cantilever (cantilever beam) structure (see FIG. 3), and perform bending displacement by the deformation of a piezoelectric substance due to the inverse piezoelectric effect. That is, in the piezoelectric actuator units 14, 16, one end portions in the x-direction (the base end portions 14B, 16B) are fixedly supported by the fixing frame 30, and the end portions 14A, 16A on the opposite side, without being fixed by a frame or the like, are unconstraint ends that can be displaced because of the cantilever structure.

The end portion 14A on the unconstraint side of the first piezoelectric actuator unit 14 is connected with one end portion 18A of the first linking unit 18, which is configured in a meandering form. Further, the other end portion 18B of the first linking unit 18 is connected with the first end portion 12A of a side along the x-axis direction of the mirror unit 12.

Similarly, the end portion 16A on the unconstraint side of the second piezoelectric actuator unit 16 is connected with one end portion 20A of the second linking unit 20, which is configured in a meandering form. Further, the other end portion 20B of the second linking unit 20 is connected with the second end portion 12B in the x-axis direction of the mirror unit 12.

The end portions (12A, 12B) in the x-axis direction of the mirror unit 12, with which the first linking unit 18 and the second linking unit 20 are connected respectively, are not required to be the farthest end positions in a strict sense, and include sites in ranges that are roughly grasped as end portions (at the farthest end positions and near the peripheries thereof).

Figure 4:
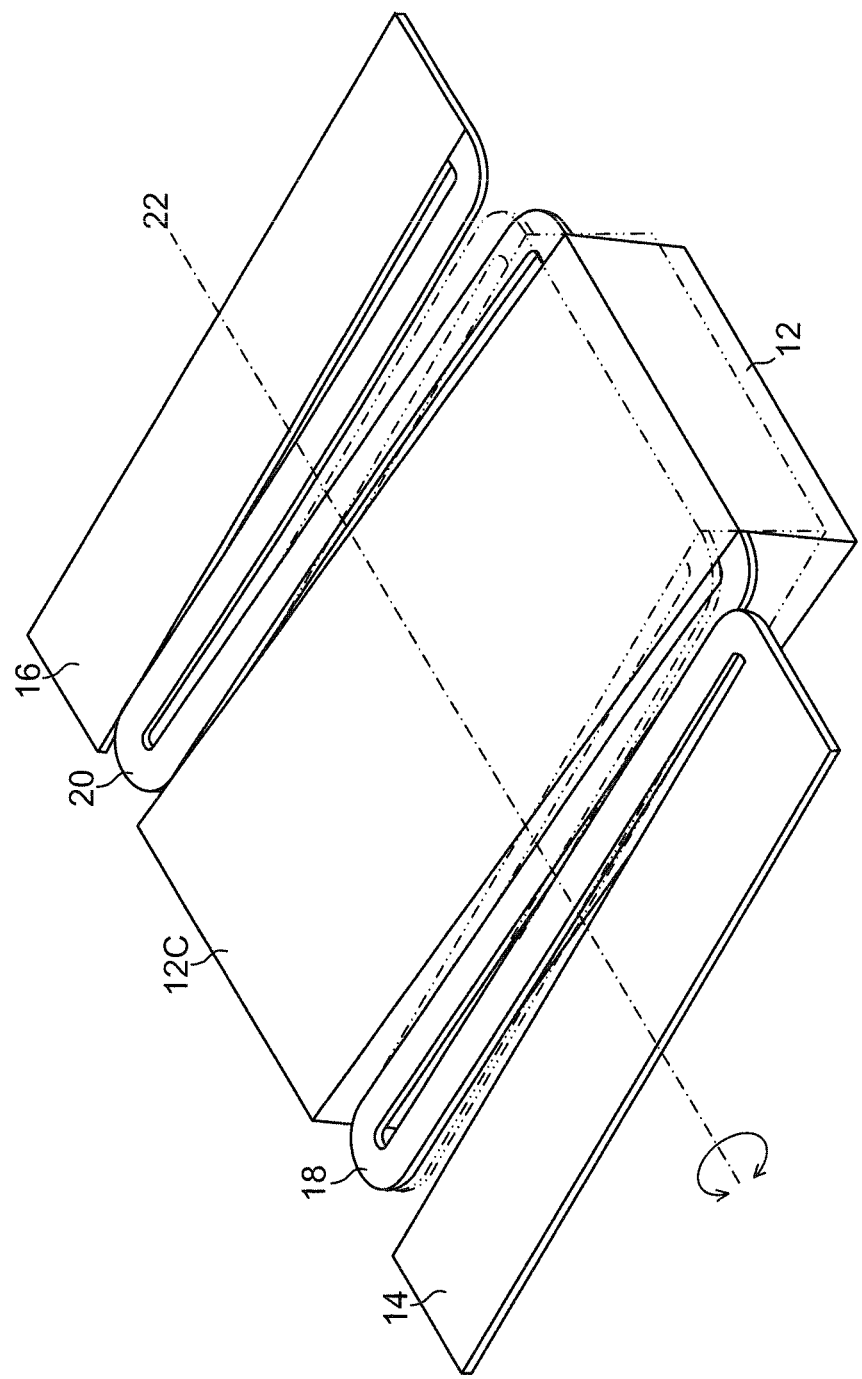
FIG. 4 is a perspective view showing a manner at the time of driving in a rotation resonance mode.

The MEMS scanner device 10 according to the embodiment drives the first piezoelectric actuator unit 14 and the second piezoelectric actuator unit 16 to vibrate the x-axis-directional end portions (12A, 12B) of the mirror unit 12 up and down (in the thickness direction of the mirror unit 12), and thereby excites, to the mirror unit 12, the rotational resonance motion around a rotation axis 22 parallel to the y-axis, to perform the rotational drive of the mirror unit 12 (see FIG. 4). The rotation axis 22 is a line that goes through a nearly central point of the reflection surface 12C and that is parallel to the y-axis. The first linking unit 18 and the second linking unit 20 are connected with sites that are near the peripheries of the end portions of the mirror unit 12 and that are away in the x-axis direction from the mirror center within ranges allowing for the achievement of such an intended resonant drive. That is, the first end portion 12A and second end portion 12B of the mirror unit 12 with which the first linking unit 18 and the second linking unit 20 are connected respectively are portions containing the ends of the mirror unit 12 away in the x-axis direction (in the direction perpendicular to the rotation axis 22) along the reflection surface 12C from the rotation axis 22 and the ranges around the vicinities of the ends.

The first linking unit 18 and the second linking unit 20 have a structure in which multiple thin plate members 19 (corresponding to "plate-shaped members") having a flat-plate bar shape, whose longitudinal direction is the x-axis direction, are arrayed so as to be folded back in a meandering form. As for each of the first linking unit 18 and the second linking unit 20, the embodiment exemplifies a structure in which two thin plate members 19 are arrayed in parallel and end portions of these two thin plate members 19 are connected with each other such that they are folded back in a meandering form. However, the number of the thin plate members 19 configuring each of the linking units (18, 20) is not particularly limited, and an appropriate number can be adopted if it is one or more.

The first linking unit 18 and the second linking unit 20 each function as plate-shaped hinge units that deform the respective thin plate members 19 such that they are deflected (bent) in the thickness direction, by the drive of the first piezoelectric actuator unit 14 and the second piezoelectric actuator unit 16.

When the piezoelectric actuator units 14, 16 are driven and the end portions 14A, 16A of the piezoelectric actuator units 14, 16 are vibrated, the inertia force in the opposite direction to an acceleration direction (a direction in which force is applied) of the end portions 14A, 16A of the respective piezoelectric actuator units 14, 16 acts on the mirror unit 12. The inertia force matches a direction in which the mirror unit 12 is inclined, and therefore, the force generated in the piezoelectric actuator units 14, 16 is efficiently utilized as the force for inclining the mirror unit 12.

In such a bending hinge structure using the thin plate members 19, when the piezoelectric actuator units 14, 16 are driven at the resonant frequency of the mirror rotation motion, the respective thin plate members 19 of the linking units 18, 20 are deflected (bent) with the displacement of the piezoelectric actuator units 14, 16, an inertia torque is generated in the mirror unit 12, and the rotational motion resonance of the mirror unit 12 is induced.

Since the displacement direction of the piezoelectric actuator units 14, 16 roughly coincides with the rotation direction of the mirror unit 12 at all times and the whole force is used for the rotation of the mirror, the use efficiency of the force is much more excellent compared to the torsion bar structure. Further, even in the case of a large rotation angle, the energy loss is reduced, and therefore, a large displacement (inclination angle) can be obtained.

Further, the linking units 18, 20 in a meandering form that join the mirror unit 12 and the piezoelectric actuator units 14, 16 accumulate the displacement by the gradual bending of the respective thin plate members 19, and therefore, have an advantage that the stress to be applied to the individual thin plate members 19 is reduced, and even in the case of a large rotation angle, they are hard to break.

Here, for convenience of explanation, the multiple thin plate members 19 configuring the first linking unit 18 and the second linking unit 20 are referred to as the first thin plate member 19-1, the second thin plate member 19-2, the third thin plate member 19-3 and the fourth thin plate member 19-4, in the order from left to right in FIG. 1 (from top to bottom in FIG. 2).

That is, the first linking unit 18 is configured such that the first thin plate member 19-1 and the second thin plate member 19-2 are joined. The second linking unit 20 is configured such that the third thin plate member 19-3 and the fourth thin plate member 19-4 are joined. Each thin plate member (19-$i$, where $i=1, 2, 3, 4$) is provided with a sensor unit 24-$i$ ($i=1, 2, 3, 4$) having a laminate structure of a lower electrode, a piezoelectric substance and an upper electrode, similarly to each piezoelectric actuator unit (14, 16).

Here, for avoiding confusion in term, the upper electrodes of the piezoelectric actuator units (14, 16) are referred to as the "drive electrodes", and are designated by reference numerals 15 and 17. Further, the upper electrodes of the sensor units 24-$i$ ($i=1, 2, 3, 4$) are referred to as the "detection electrodes", and are designated by reference numerals 25-$i$ ($i=1, 2, 3, 4$). The drive electrodes 15, 17 and the detection electrodes 25-$i$ ($i=1, 2, 3, 4$) are separated from each other.

In the figures, reference numerals 31, 32, 33 and 34 provided on the surface of the fixing frame 30 designate output terminals for detection signal output. The respective output terminals 31 to 34 are connected with the corresponding detection electrodes 25-$i$ ($i=1, 2, 3, 4$) through fine wires 51 to 54, respectively. Here, the respective wires 51 to 54 are patterned on the piezoelectric substance film.

The wire 51, which is led out of the detection electrode 25-1 formed on the top surface of the first thin plate member 19-1, is led, from the first thin plate member 19-1, around the proximity of the upper electrode (drive electrode 15) of the first piezoelectric actuator unit 14 along the longitudinal direction, to be joined to the output terminal (first output terminal) designated by reference numeral 31.

The wire 52, which is led out of the detection electrode 25-2 formed on the top surface of the second thin plate member 19-2, is led around the proximity of the detection electrode 25-1 of the first thin plate member 19-1 along the longitudinal direction, and therewith, is led around the proximity of the upper electrode (drive electrode 15) of the first piezoelectric actuator unit 14 along the longitudinal direction, to be joined to the output terminal (second output terminal) designated by reference numeral 32.

The wire 53, which is led out of the detection electrode 25-3 formed on the top surface of the third thin plate member 19-3, is led around the proximity of the detection electrode 25-4 of the fourth thin plate member 19-4 along the longitudinal direction, and therewith, is led around the proximity of the upper electrode (drive electrode 17) of the second piezoelectric actuator unit 16 along the longitudinal direction, to be joined to the output terminal (third output terminal) designated by reference numeral 33.

The wire 54, which is led out of the detection electrode 25-4 formed on the fourth thin plate member 19-4, is led, from the fourth thin plate member 19-4, around the proximity of the upper electrode (drive electrode 17) of the second piezoelectric actuator unit 16 along the longitudinal direction, to be joined to the output terminal (fourth output terminal) designated by reference numeral 34.

Thus, the detection electrodes 25-$i$ ($i=1, 2, 3, 4$) of the respective thin plate members 19-$i$ ($i=1, 2, 3, 4$) are individually (independently) connected with the corresponding output terminals (31 to 34), and detection signals can be independently acquired from the respective sensor unit 24-$i$ ($i=1, 2, 3, 4$). Here, the lower electrode can be configured as a common electrode (an integrally joined common electrode) among the multiple sensor units 24-$i$ ($i$=1, 2, 3, 4).

As shown in FIG. 2, the first piezoelectric actuator unit 14 and the second piezoelectric actuator unit 16 are connected with a driving circuit 62 through a member for wiring such as wire bonding. Further, the output terminals (31 to 34) of the sensor unit 24-$i$ ($i$=1, 2, 3, 4) are connected with a detecting circuit 64.

Figure 3:
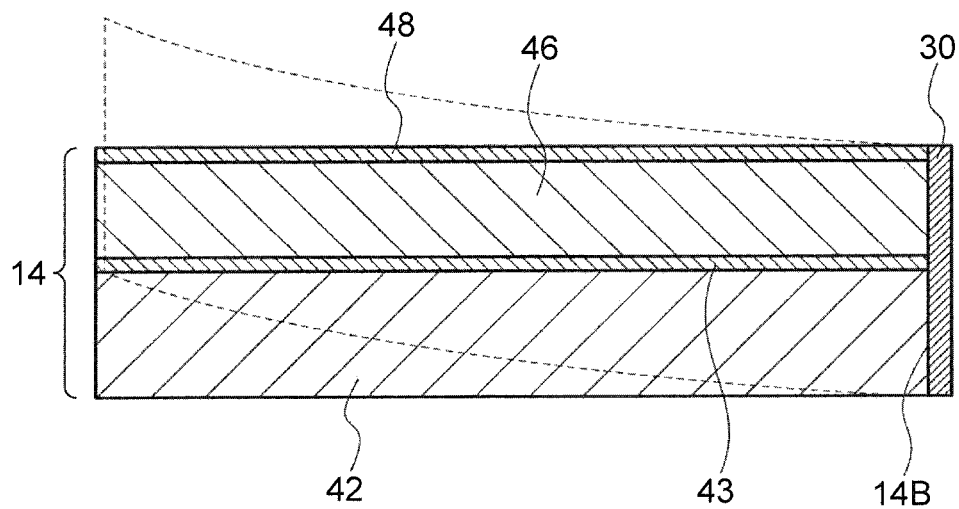
FIG. 3 is a cross-section view of a piezoelectric actuator unit.

FIG. 3 is a schematic diagram showing a cross-section structure of the piezoelectric actuator units 14, 16 having a piezoelectric unimorph cantilever structure. The piezoelectric actuator units 14, 16 have the same structure, and therefore, as a representative of them, the structure of the piezoelectric actuator unit of reference numeral 14 is described. Here, in the practice of the present invention, as the piezoelectric actuator unit, a structure other than the unimorph cantilever may be used. For example, a bimorph cantilever in which two piezoelectric substance layers are laminated so as to sandwich electrodes may be used.

As shown in FIG. 3, the piezoelectric actuator unit 14 has a structure in which a lower electrode 43, a piezoelectric substance 46 and an upper electrode 48 are laminated and formed on a vibration plate 42. Such a laminate structure body can be obtained, for example, by sequentially forming the respective layers of the lower electrode 43, piezoelectric substance 46 and upper electrode 48 on a silicon (Si) substrate. The right end in FIG. 3 is the fixed end that is supported by the fixing frame 30 (see FIG. 1 and FIG. 2).

In the configuration shown in FIG. 3, a drive voltage is applied between the electrodes (43, 48), and thereby, the piezoelectric substance 46 is deformed. In association with the deformation, the vibration plate 42 is deflected, and the lever unit moves up and down. The broken line in FIG. 3 shows a manner in which the lever unit is displaced upward. The piezoelectric actuator units 14, 16 are means for converting an electric signal into a mechanical displacement by utilizing the inverse piezoelectric effect of the piezoelectric substance 46.

Meanwhile, the sensor units 24-$i$ ($i$=1, 2, 3, 4) provided on the linking units (18, 20) also have the same laminate structure as FIG. 3. The sensor units 24-$i$ ($i$=1, 2, 3, 4) are used as means for converting a mechanical distortion (stress) into an electric signal by utilizing the piezoelectric effect of the piezoelectric substance 46.

<About Supply Method for Drive Voltage>

In the first embodiment, the driving circuit 62 applies the same drive voltage to the pair of piezoelectric actuator units 14, 16 simultaneously, and thereby, the piezoelectric actuator units 14, 16 at both sides of the mirror unit 12 are displaced in the same direction. Therefore, as a power supply source to supply the power for drive to the pair of piezoelectric actuator units 14, 16, the common (same) driving circuit 62 can be used. As the drive waveform to be supplied to the piezoelectric actuator units 14, 16, a sinusoidal waveform signal or pulse waveform signal that has a frequency for exciting the resonance can be used.

<About Action of MEMS Scanner Device 10>

The MEMS scanner device 10 according to the first embodiment acts as follows.

When the driving circuit 62 applies the same drive voltage to the pair of piezoelectric actuator units 14, 16 simultaneously, the piezoelectric actuator units 14, 16 are displaced, and the linking units 18, 20 in a meandering form that are connected with them are bent and deformed. Then, the end portions 12A, 12B of the mirror unit 12 that are connected with the linking units 18, 20 are displaced in the vertical direction (z-axis direction). By this action, the rotational torque is given to the mirror unit 12, and the mirror unit 12 performs the rotational motion around the rotation axis 22.

For example, by the application of a sinusoidal wave drive voltage to the piezoelectric actuator units 14, 16, the piezoelectric actuator units 14, 16 are vibrated up and down, and the rotational motion of the mirror unit 12 is induced. When the resonant drive is performed by the application of a drive voltage having a frequency near the resonant frequency, the mirror unit 12 vibrates at a large inclination angle.

Figure 5:
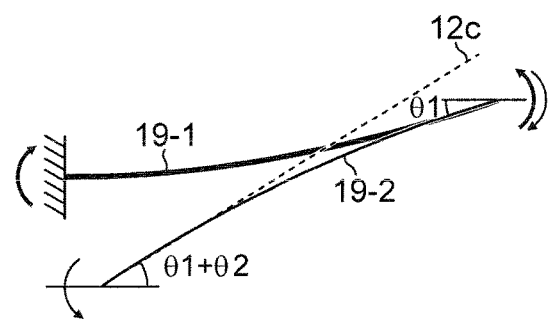
FIG. 5 is a schematic diagram of a first linking unit (plate-shaped hinge unit) shown in FIG. 4, as viewed from the positive direction of the y-axis.

The linking units 18, 20 in a meandering form are easily bent and deformed, and therefore, are effective in obtaining a large displacement in the resonant drive (see FIG. 4 and FIG. 5). Here, the frequency of the drive voltage to be applied to the piezoelectric actuator units 14, 16 is not necessarily required to strictly coincide with the mechanical resonant frequency of the structure body. The difference in the frequency of the drive voltage is allowable in a range in which the resonance is excited.

The rotational resonance motion enables the mirror unit 12 to be displaced around the rotation axis 22 at a large rotation angle. That is, in response to the drive of the piezoelectric actuator units 14, 16, the mirror unit 12 at the middle swings around the rotation axis 22. The light (for example, the laser beam emitted from a laser beam source not shown in the figure) having entered the reflection surface 12C of the mirror unit 12 is reflected depending on the inclination (angle) of the mirror unit 12, and the advancing direction of the reflected light (the irradiation position of the reflected light) is changed. The MEMS scanner device 10 according to the embodiment can perform light scanning at a large deflection angle.

<About Angle Detection Method>

FIG. 4 and FIG. 5 are explanatory diagrams for explaining the stress (pxx component) to be applied to the linking units (plate-shaped hinge units) during the resonant drive. FIG. 4 is a perspective view showing a manner at the time of driving in a rotation resonance mode. FIG. 5 is a schematic diagram of the first linking unit 18 shown in FIG. 4, as viewed from the positive direction of the y-axis. Here, in FIG. 4, the description of the fixing frame 30 is omitted. Further, from the symmetry of the device structure, the action of the second linking unit 20 is the same as the action of the first linking unit 18.

As shown in FIG. 4, during the action of the resonant drive, the thin plate members 19-1, 19-2 configuring the first linking unit 18 are deformed so as to be deflected in opposite directions to each other, and stresses in opposite directions to each other are applied to the surfaces of the respective thin plate members 19-1, 19-2. That is, as shown in FIG. 5, when the first thin plate member 19-1 performs such an action (bending deformation) that it becomes convex downward, the second thin plate member 19-2 performs such an action that it becomes convex upward. On this occasion, a compressive stress is applied to the surface of the first thin plate member 19-1, and a tensile stress is applied to the surface of the second thin plate member 19-2.

Thus, the adjacent first thin plate member 19-1 (hinge 1) and second thin plate member 19-2 (hinge 2) are deflected in the opposite directions to each other, and an angle displacement θ1 due to the bending of the first thin plate member 19-1 and an angle displacement θ2 due to the bending of the second thin plate member 19-2 are added to give the inclination angle of the mirror unit 12. As a result, the reflection surface 12C of the mirror unit 12 is inclined around the y-axis at an angle of (θ1+θ2).

During the rotational motion of the mirror, by the piezoelectric effect, the stresses applied to the first thin plate member 19-1 and the second thin plate member 19-2 are detected as the voltages between the upper electrodes and lower electrodes of the sensor units 24-1, 24-2, and thereby, they function as angle sensors. By detecting the stress for at least one thin plate member of the multiple thin plate members 19-i (i=1, 2, 3, 4), it is possible to estimate the angle of the mirror unit 12.

However, it is preferable to be a configuration in which the respective stresses are detected from the thin plate members that are deformed so as to be bent in the opposite directions to each other as described in FIG. 4 and FIG. 5. By detecting the respective stresses from the thin plate members that are deformed so as to be bent in the opposite directions to each other, it is possible to obtain detection signals in opposite phases (see FIG. 6). Then, by the detection of the differential between both, the detection sensitivity is doubled, and in-phase noises are cancelled, allowing for the achievement of the improvement of the S/N ratio.

The structure according to the embodiment allows for an angle detection that is excellent in linearity. Further, an AGC (Automatic Gain Control) circuit and a phase synchronization (PLL; Phase-Locked Loop) circuit are built, and using the angle detection signal acquired in that way, the feedback is performed to the voltage to be applied to the piezoelectric actuator units. Thereby, even when the resonant frequency is changed by a change in environmental temperature or the like, it is possible to keep the scan angle constant. For example, the feedback is performed to the driving circuit, such that the waveforms applied to the piezoelectric actuator units and the phases of the waveforms detected by the sensor units have predetermined values, and thereby, the resonance is maintained.

Such a feedback control circuit can be embedded in the detecting circuit 64. Further, the driving circuit 62, the detecting circuit 64 and the feedback control circuit can be collectively configured as an integrated circuit such as an ASIC (Application Specific Integrated Circuit).

<About Size of Detection Electrode>

In the example shown in FIG. 1 and FIG. 2, the detection electrode 25-i (i=1, 2, 3, 4) is formed over almost the whole of the length in the longitudinal direction of the thin plate member 19-i (i=1, 2, 3, 4). However, the size of the detection electrode 25-i (i=1, 2, 3, 4) is not limited to the example shown in the figures. The sensor unit only needs to be provided on a part of the thin plate member 19, within a range allowing for the achievement of the intended function by which the stress of the thin plate member 19 is detected, and the detection electrode having an appropriate size can be designed. However, it is necessary to take out signals from the detection electrodes through the wires 51 to 54. Therefore, from the viewpoint of relatively reducing the influence of the parasitic capacitance component and parasitic resistance component on subsequent stages such as a wiring unit, it is preferable that the areas of the detection electrodes in the sensor units are comparatively large.

<About Piezoelectric Material>

As a piezoelectric substance suitable for the embodiment, there is a piezoelechic substance containing one kind of, or two or more kinds of perovskite-type oxides (P) that are represented by the following formula.

$$\text{General Formula } ABO_3 \tag{P}$$

(In the formula, A: a chemical element at A-sites, and at least one kind of chemical element including Pb B: a chemical element at B-sites, and at least one kind of chemical element selected from the group consisting of Ti, Zr, V, Nb, Ta, Sb, Cr, Mo, W, Mn, Sc, Co, Cu, In, Sn, Ga, Zn, Cd, Fe and Ni O: an oxygen element A molar ratio of the A-site chemical element, the B-site chemical element and the oxygen element is 1:1:3 as a standard, but the molar ratio thereof may be deviated from the standard molar ratio, within a range allowing for a perovskite structure.)

Examples of the perovskite-type oxide to be represented by the above general formula include lead-containing compounds such as lead titanate, lead zirconate titanate (PZT), lead zirconate, lead lanthanum titanate, lead lanthanum zirconate titanate, lead magnesium niobate zirconium titanate, lead nickel niobate zirconium titanate, and lead zinc niobate zirconium titanate, and a mixed crystal system of them; and non-lead-containing compound such as barium titanate, barium strontium titanate, bismuth sodium titanate, bismuth potassium titanate, sodium niobate, potassium niobate, lithium niobate, and bismuth ferrite, and a mixed crystal system of them.

Further, it is preferable that the piezoelectric substance film according to the embodiment contain one kind of, or two or more kinds of perovskite-type oxides (PX) that are represented by the following formula.

$$\text{General Formula } A_a(Zr_x, Ti_y, M_{b-x-y})_b O_c \tag{PX}$$

(In the formula, A: a chemical element at A-sites, and at least one kind of chemical element including Pb M is at least one kind of chemical element selected from the group consisting of V, Nb, Ta and Sb.

$0 < x < b$, $0 < y < b$, and $0 \le b - x - y$ a:b:c=1:1:3 is standard, but the molar ratio thereof may be deviated from the standard molar ratio, within a range allowing for a perovskite structure.)

The perovskite-type oxide (PX) is intrinsic PZT, or a PZT in which M is substituted for a part of the B-sites. It is known that, in a PZT to which various kinds of donor ions having a higher valence than the valence of the substitution-target ion have been added, properties such as piezoelectric performance are improved relative to intrinsic PZT. It is preferable that M is one kind of, or two or more kinds of donor ions that have a higher valence than quadrivalent Zr and Ti. Examples of such a donor ion include $V^{5+}$, $Nb^{5+}$, $Ta^{5+}$, $Sb^{5+}$, $Mo^{6+}$, and $W^{6+}$, and the like.

Within a range allowing for a perovskite structure, b−x−y is not particularly limited. For example, when M is Nb, the molar ratio of Nb/(Zr+Ti+Nb), preferably, should be 0.05 or more and 0.25 or less, and more preferably, should be 0.06 or more and 0.20 or less.

A piezoelectric substance film composed of the perovskite-type oxide represented by the above-described General Formulas (P) and (PX) has a high piezoelectric distortion constant (d31 constant), and therefore, a piezoelectric actuator including such a piezoelectric substance film is excellent in displacement property.

Further, the piezoelectric actuator including the piezoelectric substance film composed of the perovskite-type oxide represented by General Formulas (P) and (PX) has a voltage-displacement property that is excellent in linearity. These piezoelectric materials exhibit a good actuator property and sensor property, in the practice of the present invention. Here, the perovskite-type oxide represented by General Formula (PX) has a higher piezoelectric constant than that represented by General Formula (P).

As a specific example of the piezoelectric substance 46 according to the embodiment, a lead zirconate titanate (PZT) thin film in which 12% Nb in atomic composition percentage has been doped can be used, for example. The film of the PZT in which 12% Nb has been doped is formed by a sputtering method or the like, and thereby, it is possible to stably make a thin film having a high piezoelectric property of a piezoelectric constant d31=250 pm/V. Here, a piezoelectric substance in bulk may be jointed on a substrate and may be polished, but in that method, it is difficult to perform the thinning of the piezoelectric substance (in polishing, the limit is about 15 μm). Therefore, in that method, there is a problem in that the displacement amount is small and the yield ratio is low because of the breaking during the polishing, and the like. In view of these, it is preferable to be a configuration in which the piezoelectric thin film is directly formed on the substrate by a vapor growth method, a sol-gel method of the like. Particularly, it is preferable that the piezoelectric substance 46 according to the embodiment is a thin film having a thickness of 1 μm or more and 10 μm or less.

<About Film Formation Method>

As the film formation method for the piezoelectric substance, a vapor growth method is preferable. For example, in addition to a sputtering method, various methods such as an ion plating method, a MOCVD method (metal organic chemical vapor growth method) and a PLD method (pulsed laser deposition method) can be applied. Further, using a method (for example, a sol-gel method) other than the vapor growth method may be considered.

In Example 1 described later, as the piezoelectric substance 46, a PZT thin film that is formed by a sputtering method and that has a thickness of 4 μm is used, but the piezoelectric substance 46 is not limited to this.

Example 1; An Example of a Specific Production Method

As Example 1, the MEMS scanner device 10 was made in the following procedure.

(Step 1) By a sputtering method, a Ti layer of 30 nm and an Ir electrode layer of 150 nm were formed at a substrate temperature of 350° C., on a SOI (Silicon On Insulator) substrate having a handle layer of 350 μm, a box layer of 1 μm and a device layer of 10 μm. These Ti layer and Ir electrode layer correspond to the lower electrode 43 in FIG. 3.

(Step 2) On the substrate obtained above, a PZT layer of 4 μm was formed using a high frequency (RF; radio frequency) sputtering apparatus. As a film formation gas, a mixed gas of 97.5% Ar and 2.5% $O_2$ was used, and as a target material, a material having a composition of $Pb_{1.3}((Zr_{0.52}Ti_{0.48})_{0.88}Nb_{0.12})O_3$ was used. The film formation pressure was 2.2 mTorr (about 0.293 Pa), and the film formation temperature was 450° C. The obtained PZT layer was a Nb-doped PZT thin film in which 12% Nb in atomic composition ratio had been added.

(Step 3) On the substrate obtained above, the pattern formation of a Pt/Ti layer as the upper electrode was performed by a lift-off method, and the pattern etching of the PZT thin film was performed by ICP (inductively coupled plasma) dry etching.

(Step 4) Thereafter, the pattern etching of the device layer was performed by the dry etching process of silicone, and the deep etching (Deep RIE; Reactive Ion Etching) of the handle layer was performed from the back surface. Finally, a Box-$SiO_2$ layer was removed from the back surface, so that a piezoelectric MEMS scanner device having the configuration shown in FIG. 1 was made. The dimensions of each part, using the symbols in FIG. 2, were L1=1 mm (millimeter), L2=2 mm, w1=0.1 mm and w2=0.4 mm.

The fixing frame 30 has a structure in which both the handle layer and the device layer are utilized, and the thickness is about 360 μm. The piezoelectric actuator unit and the plate-shaped hinge unit both have a laminate structure of the Si device layer (10 μm), the lower electrode, the PZT thin film and the upper electrode.

Further, the piezoelectric actuator unit functions as a piezoelectric thin film unimorph actuator that is deformed so as to be deflected up and down by the application of a voltage between the upper and lower electrodes.

The piezoelectric actuator units 14, 16 have a laminate structure of the Si device layer (10 μm), the lower electrode, the PZT thin film and the upper electrode, and functions as a piezoelectric thin film unimorph actuator.

In Example 1, the PZT thin film is formed by being directly formed on the substrate by the sputtering method and thereafter being processed by the dry etching. By performing the thinning of the piezoelectric substance in this way, it is possible to simplify the making process and to perform a fine patterning. Thereby, it is possible to drastically improve the yield ratio and to cope with a further downsizing of the device.

However, the configuration in the practice of the present invention is not limited to the thin film piezoelectric substance. A bulk piezoelectric substance may be bonded to a vibration plate, and thereby a unimorph actuator may be formed. Alternatively, two piezoelectric substances having different polarities may be bonded, and thereby a bimorph actuator may be formed. In the practice of the present invention, without being limited to the above Example 1, the substrate material, the electrode material, the piezoelectric material, the film thickness, the film formation condition and the like can be appropriately selected depending on the purpose.

<Evaluation of MEMS Scanner Device According to Example 1>

For the MEMS scanner device 10 according to Example 1 made in the above procedure, a drive voltage of a sinusoidal wave (sine wave) with a potential amplitude Vp–p=1.2 V (volt) was applied to the piezoelectric actuator units (14, 16), the rotational resonance motion of the mirror around the rotation axis was induced, and the mechanical deflection angle of the mirror unit was measured by the scan angle of a laser. Then, a resonant frequency fx=154 Hz and a mechanical deflection angle=±22° were obtained.

Next, for driving, a sinusoidal wave with Vp–p=1.2 V was input at a frequency coinciding with the resonant frequency, and signals from the respective detection electrodes 25-1 to 25-4 were detected by a lock-in amplifier. Then, a voltage output with a potential amplitude of 470 mV (millivolt) was obtained from the detection electrodes 25-1, 25-4, and a voltage output with a potential amplitude of 490 mV was obtained from the detection electrodes 25-2, 25-3. Furthermore, the phase difference between these signals was 180° (see FIG. 7).

Figure 6:
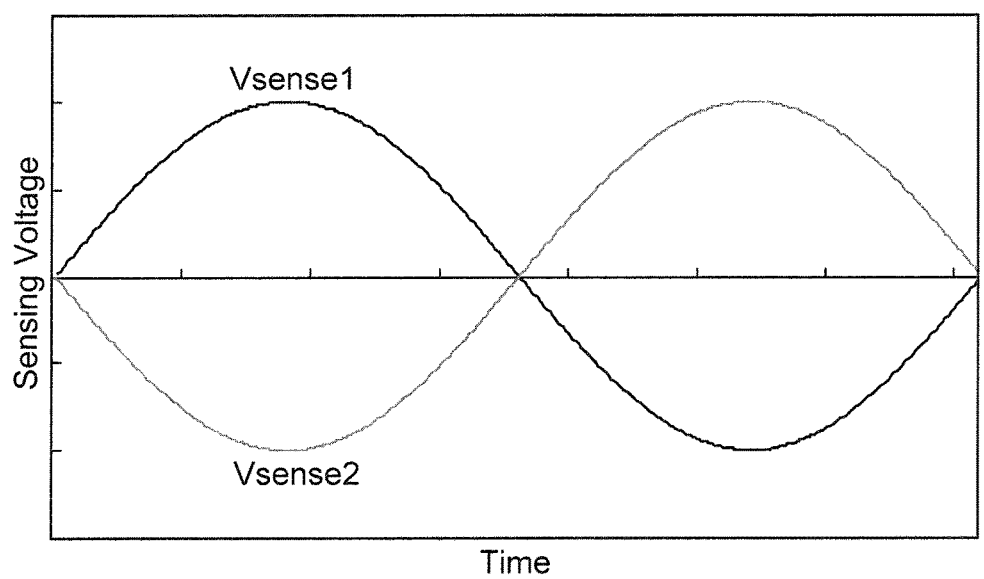
FIG. 6 is a diagram showing an example of angle detection signals to be acquired by the stress detection of a linking unit.

In FIG. 6, "Vsense1" shows the signals from the detection electrodes 25-1, 25-4, and "Vsense2" shows the signals from the detection electrodes 25-2, 25-3.

Figure 7:
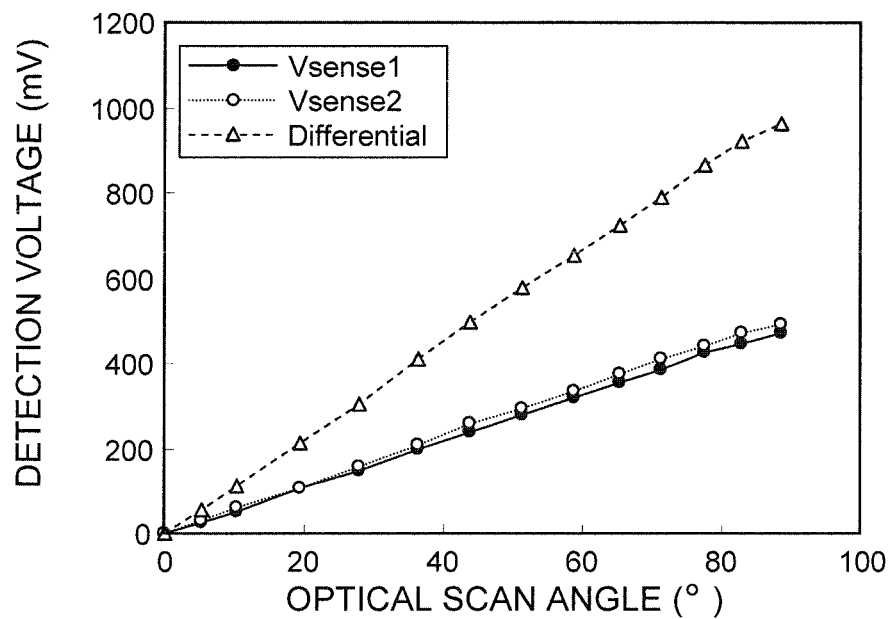
FIG. 7 is a graph showing a relation between optical scan angles and detection voltages.

Further, FIG. 7 shows plots of the relation between the scan angle and the detection voltage when the drive voltage to be given to the piezoelectric actuator units 14, 16 was changed. In FIG. 7, "Differential" shows the differential between the two voltage signals (Vsense1, Vsense2) that was detected by a differential circuit. The angle detectability of each detection electrode was as follows.

Vsense1: 5.41 mV/deg
Vsense2: 5.61 mV/deg
Differential: 11 mV/deg

Thus, from the detection signals (Vsense1, Vsense2) in the opposite phases, the differential between both are detected, and the detection of the angle is performed using the differential signal. Thereby, the drift of the detection signals and in-phase noises are removed, and the S/N ratio is improved. The differential circuit is embedded in the detecting circuit 64 shown in FIG. 2.

<About Combination of Thin Plate Members to Detect Stress>

As described previously, the MEMS scanner device 10 shown in FIG. 1 has a bilaterally symmetric structure across the mirror unit 12. During the resonant drive, the first thin plate member 19-1 and the fourth thin plate member 19-4 perform an equivalent action, and the second thin plate member 19-2 and the third thin plate member 19-3 perform an equivalent action. Then, from the sensor unit 24-1 on the first thin plate member 19-1 and the sensor unit 24-4 on the fourth thin plate member 19-4, a similar detection signal (Vsense1 in FIG. 6) is obtained. Further, from the sensor unit 24-2 on the second thin plate member 19-2 and the sensor unit 24-3 on the third thin plate member 19-3, a similar detection signal (Vsense2 in FIG. 6) is obtained.

Therefore, for obtaining a pair of detection signals (Vsense1, Vsense2) that are in opposite phases to each other, the combination of the first thin plate member 19-1 and the third thin plate member 19-3, the combination of the second thin plate member 19-2 and the fourth thin plate member 19-4, and the combination of the third thin plate member 19-3 and the fourth thin plate member 19-4 are also possible, in addition to the combination of the first thin plate member 19-1 and the second thin plate member 19-2, and any combination may be adopted.

Similarly, even when the number of the thin plate members 19 configuring the linking units (18, 20) is altered, it is possible to obtain detection signals in opposite phases, by appropriately selecting and combining thin plate members that are displaced in opposite directions.

Suppose that the number of the thin plate members configuring the linking units (18, 20) in a meandering form is generalized to be m (m is an integer of 2 or more). In the case of giving identification numbers to the respective thin plate members by sequentially giving, to m thin plate members, consecutive numbers j (j are integers, for example, j=1, 2, . . . m) indicating an array order, from a side close to the mirror unit 12 toward an outer piezoelectric actuator unit side, it is only necessary to combine an odd-numbered thin plate member and an even-numbered thin plate member and detect the respective stresses. Here, the initial value of the consecutive numbers j is not limited to "1", but may be "0", and an arbitrary integer can be adopted.

The embodiment shown in FIG. 1 and FIG. 2 is an example of m=2. The second thin plate member 19-2 and the third thin plate member 19-3, which are on the sides close to the mirror unit 12, are the "first (j=1)", and the first thin plate member 19-1 and the fourth thin plate member 19-4 are the "second (j=2)".

It is only necessary to adopt a configuration including a sensor unit to detect the stress that is generated in at least one thin plate member selected from the odd-numbered thin plate members, and a sensor unit to detect the stress that is generated in at least one thin plate member selected from the even-numbered thin plate members, and to detect signals from both of these sensor units respectively.

Therefore, it is not necessarily required to provide the sensor unit for all the thin plate members 19-1 to 19-4, and a configuration in which a sensor unit not to be used for sensing is omitted is also possible. However, from the viewpoint of a stable resonant drive of the mirror unit 12, it is preferable to have a structural symmetry. By forming the laminate structure of the lower electrode, the piezoelectric substance and the upper electrode also for a thin plate member not to be used for sensing, it is possible to secure a structural symmetry.

Example 2

Figure 8:
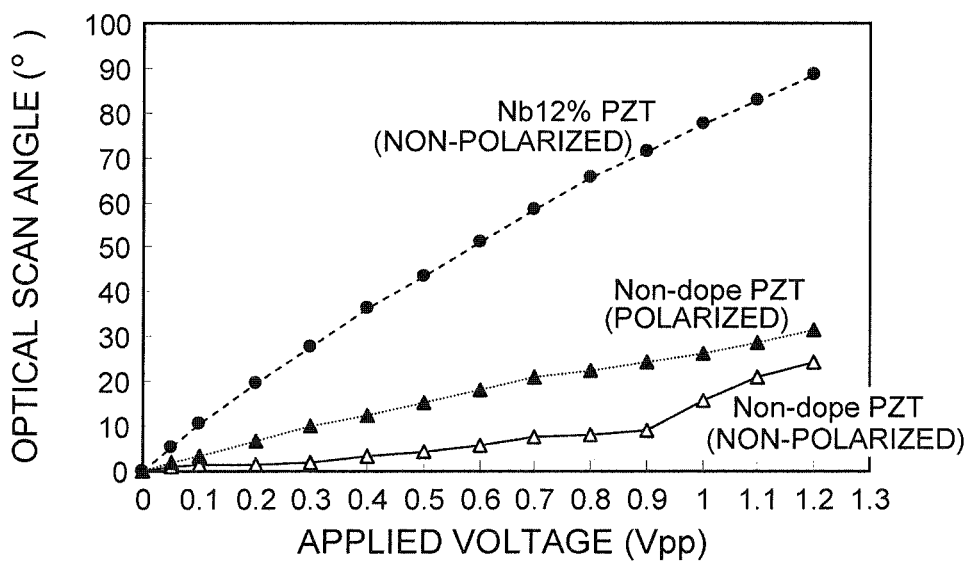
FIG. 8 is a graph showing a relation between applied voltages and optical scan angles.

In Example 2, a MEMS scanner device having the same structure as Example 1 was made by the same making method as Example 1, except that a material having a composition of $Pb_{1.3}(Zr_{0.52}Ti_{0.48})O_3$ was used as the target material in the PZT film formation. For the obtained device, the same action confirmation experiment as Example 1 was performed. FIG. 8 shows a relation between applied voltages and optical scan angles. FIG. 8 concurrently describes the result of Example 1 (Nb 12% PZT).

In FIG. 8, the white triangle marks show the measurement results when a polarization process was not performed for a PZT in which Nb had not been doped. The black triangle marks show the measurement results when a polarization process was performed after the film formation for the PZT in which Nb had not been doped. The black circle marks show the measurement results of Example 1 using the PZT (with no polarization process) in which 12% Nb had been doped.

As shown in FIG. 8, in the case of the PZT in which Nb was not doped, if the polarization process was not performed after the film formation, the actuator property (sensor property) was not sufficiently exerted. Here, the polarization process was performed by connecting the lower electrode with the ground (earth) and applying −20 V to the upper electrode for one minute. On the other hand, in the case of using the PZT in Example 1 in which Nb was doped, an actuator property greatly exceeding the PZT in which Nb was not doped and the polarization process was performed was exhibited, even in the non-polarized state.

Figures 9, 10:
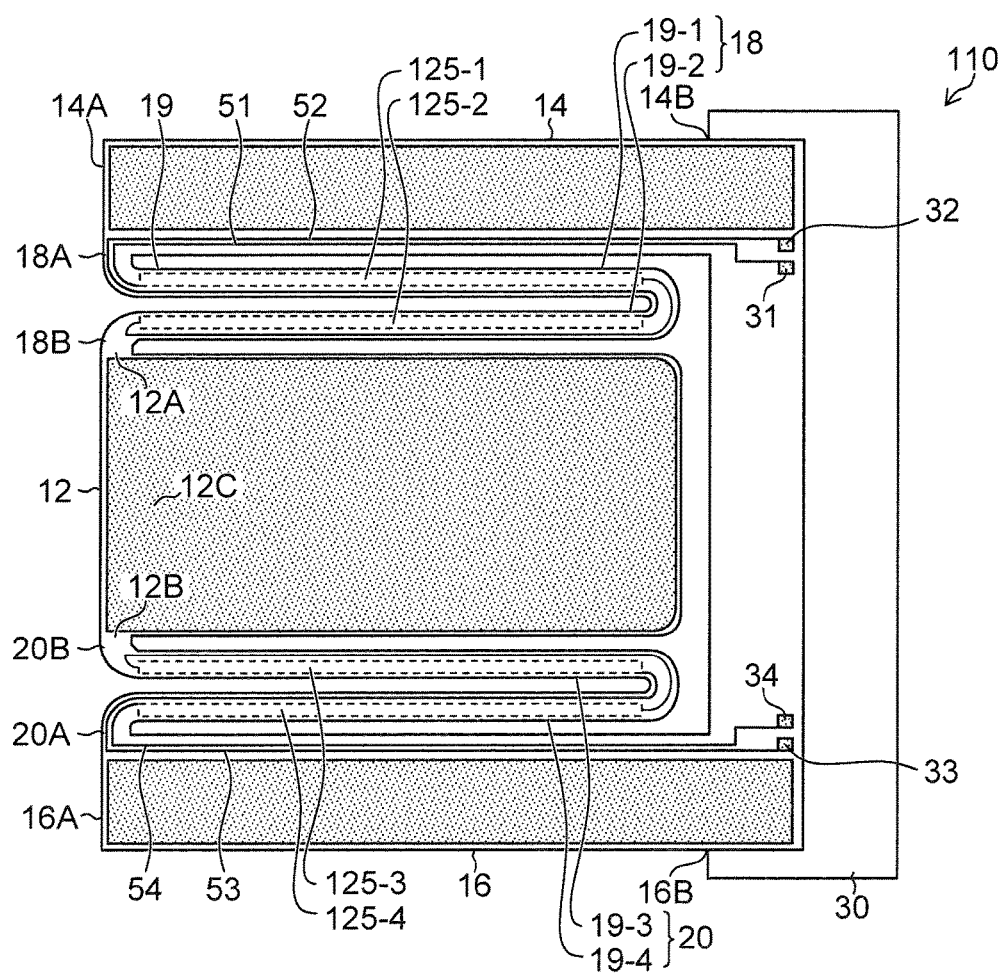
FIG. 9 is a chart in which relations between Nb doping amounts in PZT and actuator properties/sensing properties are arranged.
FIG. 10 is a plan view showing the configuration of a MEMS scanner device according to a second embodiment.

FIG. 9 shows a chart in which relations between Nb doping amounts in a PZT and actuator properties/sensing properties are arranged. In FIG. 9, for both the scan angle and the angle detectability, values when the polarization was not performed are used. As for the decision of whether the polarization process is necessary, in the case where the scan angle in the non-polarized state (when 0.5 Vpp was applied) was less than or equal to 0.8 fold of the scan angle after the polarization process, a decision of "C" (the polarization process is necessary) was made. In the case of being more than 0.8 fold and less than or equal to 0.9 fold, a decision of "A" (the use is possible with no polarization process) was made. In the case of being more than 0.9 fold, a decision of "AA" (the polarization process is unnecessary) was made.

From the result, when 6% or more Nb is doped in the PZT, the use is possible without performing the polarization process, allowing for the reduction of the production cost.

Further, the piezoelectric property increases with the increase in the Nb doping amount. Therefore, a more Nb doping amount can give a high scan angle at a lower voltage, and give a higher detection voltage in the angle detection.

<About Function Effect of Embodiment>

(1) The structure in which the piezoelectric actuator units 14, 16 and the mirror unit 12 are connected through the liking units 18, 20 folded back in a meandering form and having a plate-shaped hinge structure is adopted. When the piezoelectric actuator units 14, 16 vibrate the end portions 12A, 12B of the mirror unit 12 up and down, an inertia torque is generated and the rotational motion resonance is excited.

(2) In MEMS scanner device 10 including the above structure, the sensor units 24-$i$ ($i$=1, 2, 3, 4) as stress detecting units are provided on the thin plate members 19 of the linking units 18, 20, and during the rotational motion of the mirror, the stresses applied to the linking units 18, 20 are detected as voltage signals by the piezoelectric effect. From the voltage signals, the angle of the mirror unit 12 can be grasped.

(3) When the PZT in which 6% or more Nb has been doped is used as the piezoelectric material, it is unnecessary to perform the polarization process for getting out both of the actuator property and sensing property of the PZT, allowing for the simplification of the process and the reduction of the production cost.

(4) Even when the design is performed for a low resonant frequency of 400 Hz or lower, the rigidity at the parts of the respective thin plate members 19 can be kept relatively high, and therefore, the breaking by an external vibration is inhibited compared to the torsion bar system.

(5) Since the structure in which the linking units 18, 20 as the plate-shaped hinge units are folded back in a meandering form is adopted, the rotational torque during the drive is dispersed, and the stress to be applied to each one of the thin plate members is reduced. Therefore, it is possible to perform a stable drive, even at a large scan angle.

(6) The embodiment allows for the angle detection, in spite of a structure having no torsion bar. In the case of the detection by the piezoelectric effect, the piezoelectric constant, in an operating temperature range, is little affected by temperature. Therefore, a circuit for correcting the coefficient change by temperature and the like are unnecessary. Accordingly, the angle can be detected by a simple configuration.

(7) Signals in opposite phases to each other are obtained from a detection electrode provided on an odd-numbered thin plate member with respect to the side close to the mirror unit 12 and a detection electrode provided on an even-numbered thin plate member with respect to the side close to the mirror unit (see FIG. 6). Therefore, by obtaining the differential between these signals, it is possible to double the detection sensitivity, and therewith, increase S/N.

(8) As described in Examples 1 and 2, the PZT thin film is directly formed on the substrate, and to this, the etching process is performed. Thereby, the MEMS scanner device can be formed. By performing the thinning of the piezoelectric substance in this way, it is possible to easily perform a finer patterning. Therefore, it is possible to drastically improve the yield ratio and to cope with a further downsizing of the device.

Second Embodiment

The first embodiment, and Examples 1 and 2 use the structure in which the piezoelectric substance thin film is laminated on the linking units 18, 20 functioning as the plate-shaped hinge units, and the stresses are converted into voltages by the piezoelectric effect. However, the means for detecting the stress in the plate-shaped hinge unit is not limited to this example. For example, as the means for detecting the stress to be generated in the linking unit, a mode in which the piezo-resistance effect is utilized is also possible. As an example thereof, a configuration in which boron doping is performed to the surfaces of the linking units 18, 20 of silicon (Si), a p-type Si layer exhibiting the piezo-resistance effect is formed, and the stress detection is performed by utilizing the change in the electric resistance of the p-type Si layer due to the applied stress may be employed.

FIG. 10 is a plan view showing the configuration of a MEMS scanner device according to a second embodiment. In FIG. 10, for elements identical or similar to FIG. 1 and FIG. 2, identical reference characters are assigned, and the descriptions are omitted. A MEMS scanner device 110 shown in FIG. 10 is provided with piezo-resistance material units 125-$i$ ($i$=1, 2, 3, 4) having p-type Si layers in each of which the boron doping has been performed to the Si surface, instead of the sensor units 24-$i$ ($i$=1, 2, 3, 4) according to the first embodiment. That is, the linking units 18, 20 are configured by a p-type Si in which boron is diffused on a part of the Si surface, and the stress is detected by utilizing a piezo-resistance effect by which the electric resistance of the p-type Si part changes due to the stress to be applied to the linking units 18, 20.

The piezo-resistance material unit 125-$i$ ($i$=1, 2, 3, 4) corresponds to the "stress detecting unit", and the resistance value changes when the stress is applied. The change in the resistance value, with use of a circuit to convert it into a voltage, is detected as a voltage signal.

Figure 11:
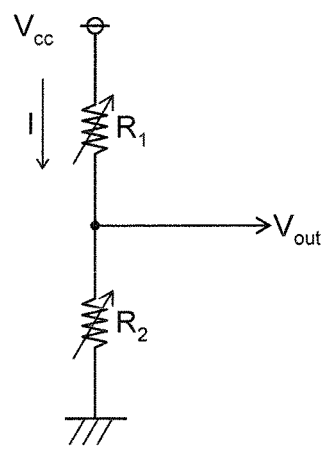
FIG. 11 is a diagram showing a configuration example of a detecting circuit to be applied to the second embodiment.

FIG. 11 is a configuration diagram of a circuit to convert a change in the resistance value into a voltage. The R1 and R2 in the figure show the resistances of piezo-resistance material units provided on thin plate members that are displaced in opposite directions to each other, respectively. That is, the R1 shows the resistance of a piezo-resistance material unit provided on an odd-numbered thin plate member (for example, the resistance of the piezo-resistance material unit 125-3 provided on the third thin plate member 19-3), and the R2 shows the resistance of a piezo-resistance material unit provided on an even-numbered thin plate member (for example, the resistance of the piezo-resistance material unit 125-4 provided on the fourth thin plate member 19-4).

As shown in figure, a voltage dividing circuit connecting the R1 and the R2 is configured, and a voltage signal Vout after the division by the R1 and the R2 is obtained. In the second embodiment, such a circuit is embedded in the detecting circuit 64. Although there is a temperature dependence in the piezo-resistance effect, the temperature-dependent component of the resistance change is cancelled by the utilization of the voltage dividing circuit in FIG. 1.

Here, as described in the first embodiment, when a system in which the piezoelectric thin film is laminated is employed, the actuator unit and the sensor unit can be formed simultaneously in the same process, allowing for the simplification of the process and the reduction of the cost.

Further, in the piezoelectric effect, the temperature dependence is low compared to the piezo-resistance effect, and the voltage signal can be obtained directly from the electrodes. Therefore, the configuration of the detecting circuit is also simple.

Third Embodiment

Figure 12:
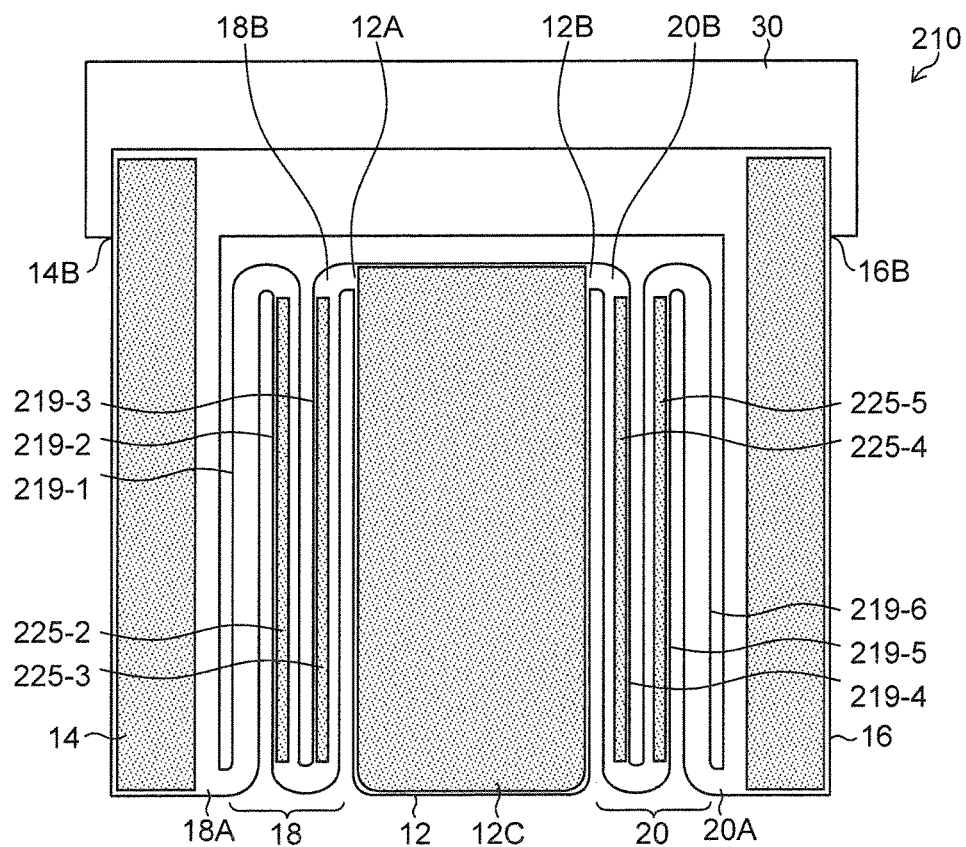
FIG. 12 is a plan view showing the configuration of a MEMS scanner device according to a third embodiment.
Figure 13:
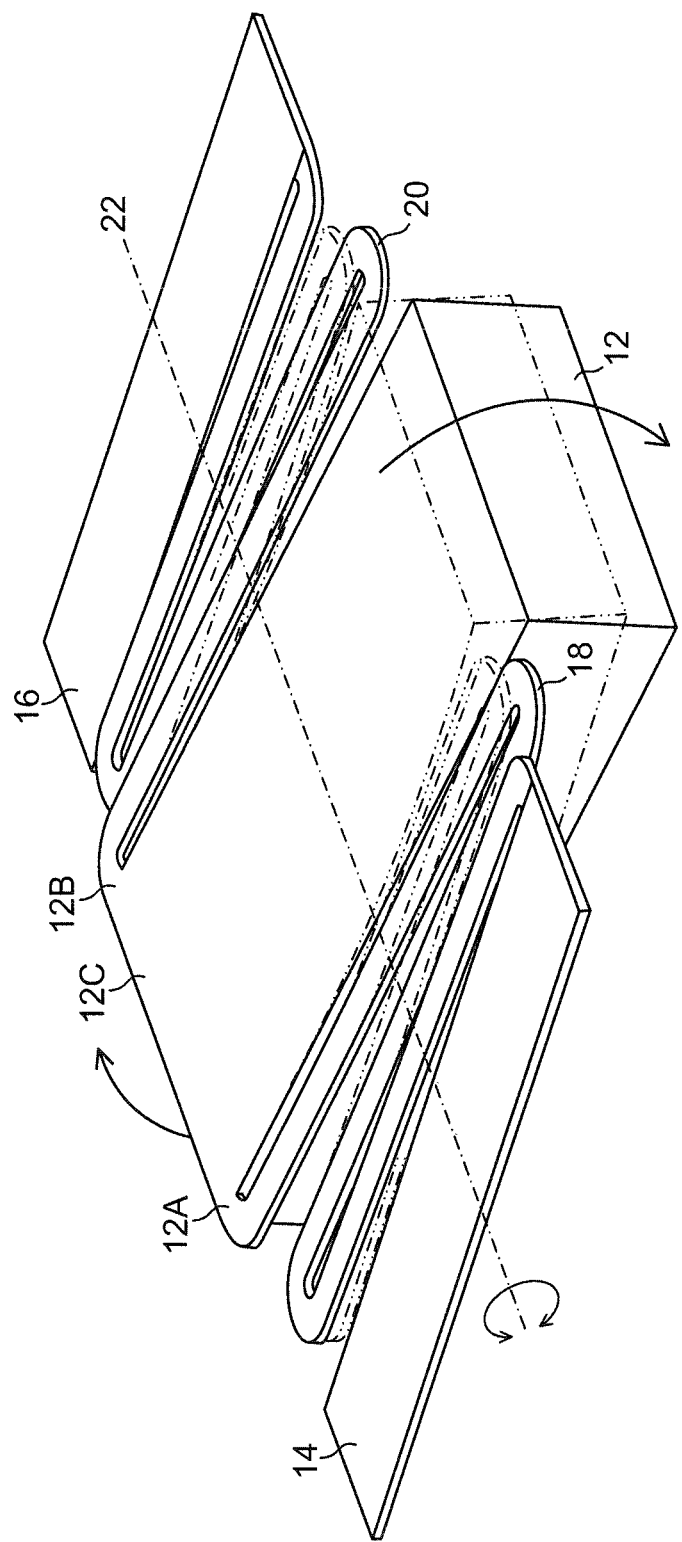
FIG. 13 is a perspective view showing a manner at the time of driving in a rotation resonance mode according to the third embodiment.

FIG. 12 is a plan view of a principal part of a MEMS scanner device 210 according to a third embodiment, and FIG. 13 is a perspective view showing an action state in the rotation resonance mode.

In these figures, for elements identical or similar to the example described in FIG. 1 and FIG. 2, identical reference characters are assigned, and the descriptions are omitted. In the third embodiment, the linking units 18, 20 functioning as the plate-shaped hinge units have a structure in which three thin plate members are joined in a meandering form. The other configuration is the same configuration as the first embodiment. Since the number of thin plate members is increased, it is possible to obtain a lower resonant frequency than the first embodiment.

The linking unit 18 shown in FIG. 12 has a structure in which thin plate members 219-1, 219-2, 219-3 are arrayed so as to be folded back in a meandering form. Further, the linking unit 20 has a structure in which thin plate members 219-4, 219-5, 219-6 are arrayed so as to be folded back in a meandering form.

Then, detection electrodes 225-3, 225-4 are provided on the odd-numbered thin plate members 219-3, 219-4 with respect to the sides close to the mirror unit 12, and detection electrodes 225-2, 225-5 are provided on the even-numbered thin plate members 219-2, 219-5. Here, for simplification of illustration, in FIG. 12, the illustration of the wires (51 to 54) and output terminals (31 to 34) is omitted.

The thin plate members designated by reference numerals 219-1, 219-6 fall under "odd-numbered", and therefore, a mode in which detection electrodes are provided on the thin plate members 219-1, 219-6 instead of the detection electrodes 225-3, 225-4 or along with them is also possible.

Similarly to the first embodiment, in the MEMS scanner device 210 according to the third embodiment shown in FIG. 12, the end portions 12A, 12B of the mirror unit 12 are vibrated up and down by the vertical drive of the piezoelectric actuator units 14, 16, and thereby, the inclining (rotational) motion of the mirror unit 12 is induced by the inertia force, and the mirror unit 12 is largely inclined by the resonant vibration (see FIG. 13). The linking units having a tortuous shape (the plate-shaped hinge units folded back in a meandering form) 18, 20 are provided between the mirror unit 12 and the piezoelectric actuator units 14, 16, and thereby, the displacement of the inclination angle of the mirror unit 12 is further enlarged. Then, it is possible to detect the stresses to be generated in the linking units during the rotational drive, and to grasp the angle of the mirror unit 12.

Here, in the practice of the present invention, as the configuration of the linking units 18, 20, the tortuous shape (meandering form) of the linking unit is not an indispensable element, and a mode in which the linking unit is configured by one thin plate member functioning as the plate-shaped hinge is also possible.

<Modification 1>

In the above-described embodiments, as the piezoelectric material to be used for the piezoelectric actuator unit and the sensor unit, PZT is selected, but naturally, it is not necessary to be limited to this material. For example, a non-lead piezoelectric substance such as $BaTiO_3$, $KNaNbO_3$ and $BiFeO_3$ can be used, and a non-perovskite piezoelectric substance such as AlN and $ZnO_2$ can be used.

<Modification 2>

Instead of the configuration of the piezoelectric actuator unit (14, 16) according to the above-described embodiments, a piezoelectric actuator unit in which multiple piezoelectric cantilevers are combined can be employed. For example, a piezoelectric cantilever having a folding structure in a meandering form can be employed. In the practice of the present invention, whether the folding structure of the cantilever unit is employed, and the number of times of folding (the number of folds) are not particularly limited. It is possible to increase the displacement amount with the increase in the number of folds of the cantilever.

Design parameters such as the number of folds of the plate hinge unit and cantilever, the width of the lever unit and the like affect the whole resonant frequency. The resonant frequency tends to be decreased as the number of folds is increased. Further, the resonant frequency tends to be decreased as the width of the lever unit or plate-shaped member (hinge plate) is thinned. By designing the number of folds, the width of the lever unit or plate-shaped member (hinge plate), or the like, it is possible to actualize an intended resonant frequency.

<Application>

The present invention can be utilized for various uses, as an optical device that reflects light such as laser beam and changes the advancing direction of the light. For example, the present invention can be widely applied to an optical deflector, an optical scanner, a laser printer, a bar code reader, a display device, various optical sensors (a distance measuring sensor, a shape measuring sensor), an optical communication device, a laser projector, an OCT image diagnosis device, and the like.

Here, the present invention is not limited to the embodiments described above, and a person having ordinary skill in the art can make many modifications within the technical idea of the present invention.

What is claimed is:

1. A mirror driving device comprising:
   a mirror unit configured to have a reflection surface to reflect light;
   a pair of piezoelectric actuator units configured to be disposed at both sides of the mirror unit so as to sandwich the mirror unit;
   linking units each of which is configured to connect one end of a corresponding one of the piezoelectric actuator units with an end portion of the mirror unit, the end portion of the mirror unit being away from a rotation axis of the mirror unit in a direction which is along the reflection surface and is perpendicular to the rotation axis; and
   a fixing unit configured to support the other end of each of the piezoelectric actuator units,
   wherein each of the linking units is a plate-shaped hinge unit that has a structure different than the structure of each of the piezoelectric actuator units, each of the linking units including one or more plate-shaped members whose longitudinal direction is a direction that is along the reflection surface and that is perpendicular to the rotation axis, and in each of the linking units, the one or more plate-shaped members are deformed so as to be deflected in a thickness direction of the fixing unit by a drive of the piezoelectric actuator units caused by a drive voltage applied to the piezoelectric actuator units, wherein the drive voltage is not applied to the linking units, and no stress is induced in the linking units by the drive voltage, and
   wherein the linking units include stress detecting units respectively provided thereon, the stress detecting units are located only on the respective linking units, and each of the stress detecting units detects a stress to be generated in a corresponding one of the linking units during a rotational drive of the mirror unit by a resonant vibration, the resonant vibration being induced by the drive of the piezoelectric actuator units and involving a rotational motion of the mirror unit.

2. The mirror driving device according to claim 1,
wherein each of the linking units has a structure in which two or more of the plate-shaped members are arrayed so as to be folded back in a meandering form, and at the time of the resonant vibration, adjacently arrayed plate-shaped members are deformed so as to be deflected in opposite directions to each other.

3. The mirror driving device according to claim 2,
wherein, when consecutive numbers indicating an array order are given to the two or more of the plate-shaped members arrayed so as to be folded back in the meandering form, from a side close to the mirror unit toward a direction of the corresponding one of the piezoelectric actuator units, and thereby, each of the plate-shaped members is identified,
the mirror driving device comprises, as the stress detecting unit,
a first stress detecting unit configured to detect a stress to be generated in an odd-numbered plate-shaped member, and
a second stress detecting unit configured to detect a stress to be generated in an even-numbered plate-shaped member.

4. The mirror driving device according to claim 3,
wherein the stress detecting unit has a laminate structure in which a lower electrode, a piezoelectric substance and an upper electrode are laminated on at least one of the plate-shaped members in order, and has a structure in which the stress is converted into an electric signal by a piezoelectric effect of the piezoelectric substance.

5. The mirror driving device according to claim 4,
wherein voltage signals are acquired from both of the first stress detecting unit and the second stress detecting unit, respectively, and
the mirror driving device comprises a detecting circuit configured to detect a differential between a first detection signal acquired from the first stress detecting unit and a second detection signal acquired from the second stress detecting unit.

6. The mirror driving device according to claim 3,
wherein a surface portion of at least one of the plate-shaped members is composed of a material exhibiting a piezo-resistance effect, and
the stress detecting unit converts the stress into a change in resistance value by the piezo-resistance effect of the material exhibiting the piezo-resistance effect.

7. The mirror driving device according to claim 6, comprising a detecting circuit configured to convert the change in resistance value into a voltage signal.

8. The mirror driving device according to claim 7,
wherein the detecting circuit acquires a voltage signal with a voltage dividing circuit configured to connect a first resistance configured by the first stress detecting unit and a second resistance configured by the second stress detecting unit.

9. The mirror driving device according to claim 1,
wherein the stress detecting unit has a laminate structure in which a lower electrode, a piezoelectric substance and an upper electrode are laminated on at least one of the plate-shaped members in order, and has a structure in which the stress is converted into an electric signal by a piezoelectric effect of the piezoelectric substance.

10. The mirror driving device according to claim 9,
wherein each of the piezoelectric actuator units is configured by a piezoelectric unimorph cantilever in which a vibration plate, a lower electrode, a piezoelectric substance and an upper electrode are laminated in order.

11. The mirror driving device according to claim 10,
wherein the piezoelectric substance to be used in each of the piezoelectric actuator units and the stress detecting unit is a thin film that has a thickness of 1 to 10 μm and that is directly forming on a substrate being the vibration plate.

12. The mirror driving device according to claim 1,
wherein a surface portion of at least one of the plate-shaped members is composed of a material exhibiting a piezo-resistance effect, and
the stress detecting unit converts the stress into a change in resistance value by the piezo-resistance effect of the material exhibiting the piezo-resistance effect.

13. The mirror driving device according to claim 12, comprising a detecting circuit configured to convert the change in resistance value into a voltage signal.

14. The mirror driving device according to claim 1,
wherein each of the piezoelectric actuator units is configured by a piezoelectric unimorph cantilever in which a vibration plate, a lower electrode, a piezoelectric substance and an upper electrode are laminated in order.

15. The mirror driving device according to claim 1,
wherein a piezoelectric substance to be used in each of the piezoelectric actuator units includes one kind of, or two or more kinds of perovskite-type oxides that are represented by the following Formula (P):

$$\text{General Formula } ABO_3 \tag{P}$$

where in Formula (P), A is a chemical element at A-sites, and is at least one kind of chemical element including Pb,
B is a chemical element at B-sites, and is at least one kind of chemical element selected from the group consisting of Ti, Zr, V, Nb, Ta, Sb, Cr, Mo, W, Mn, Sc, Co, Cu, In, Sn, Ga, Zn, Cd, Fe and Ni,
O is an oxygen element, and
a molar ratio of the A-site chemical element, the B-site chemical element and the oxygen element is 1:1:3 as a standard, but the molar ratio may be deviated from the standard molar ratio within a range allowing for a perovskite structure.

16. The mirror driving device according to claim 1,
wherein a piezoelectric substance to be used in each of the piezoelectric actuator units include one kind of, or two or more kinds of perovskite-type oxides that are represented by the following Formula (PX):

$$A_a(Zr_x, Ti_y, M_{b-x-y})_b O_c \tag{PX}$$

where in Formula (PX), A is a chemical element at A-sites, and is at least one kind of chemical element including Pb,
M is at least one kind of chemical element selected from the group consisting of V, Nb, Ta and Sb,
0<x<b, 0<y<b, and 0<b-x-y hold, and
a:b:c=1:1:3 is standard, but the molar ratio may be deviated from the standard molar ratio within a range allowing for a perovskite structure.

17. The mirror driving device according to claim 16,
wherein the perovskite-type oxide (PX) includes Nb, and a molar ratio of Nb/(Zr+Ti+Nb) is 0.06 or more and 0.20 or less.

18. The mirror driving device according to claim 1, wherein a piezoelectric substance to be used in each of the piezoelectric actuator units is a thin film that is formed by a sputtering method.

19. The mirror driving device according to claim 1, comprising
a driving circuit configured to supply a drive voltage to the pair of the piezoelectric actuator units, the driving circuit supplying the drive voltage that resonantly drives the mirror unit around a resonant frequency fx in a resonance mode in which the mirror unit performs a rotational motion about the rotation axis.

20. The mirror driving device according to claim 1, wherein each of the piezoelectric actuator units are of a different shape than each of the linking units.

* * * * *